US006623281B2

(12) United States Patent
Vinciarelli et al.

(10) Patent No.: US 6,623,281 B2
(45) Date of Patent: *Sep. 23, 2003

(54) MOUNTING ELECTRONIC COMPONENTS ON CIRCUIT BOARDS

(75) Inventors: Patrizio Vinciarelli, Boston, MA (US); Gary Keay, Merrimack, NH (US)

(73) Assignee: VLT Corporation, San Antonio, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,707

(22) Filed: Jun. 29, 1999

(65) Prior Publication Data

US 2002/0016094 A1 Feb. 7, 2002

(51) Int. Cl.⁷ ............................................... H01R 12/00
(52) U.S. Cl. ........................................................ 439/78
(58) Field of Search .............................. 439/78, 74, 62; 361/386, 719, 205, 800, 861, 761, 818, 401; 29/832, 834

(56) References Cited

U.S. PATENT DOCUMENTS

| 4,417,296 A | * | 11/1983 | Shelhorn | 29/834 |
|---|---|---|---|---|
| 4,479,686 A | * | 10/1984 | Hoshinao et al. | 439/78 |
| 4,603,927 A | * | 8/1986 | Gardner | 439/78 |
| 4,603,929 A | * | 8/1986 | Fitzpatrick | 439/78 |
| 4,685,753 A | * | 8/1987 | Isshiki | 439/74 |
| 4,959,750 A | | 9/1990 | Cnyrim et al. | 361/401 |
| 5,200,884 A | | 4/1993 | Ohashi | 361/401 |
| 5,249,971 A | | 10/1993 | Lai et al. | |
| 5,675,888 A | | 10/1997 | Owen | 439/77 |
| 6,000,125 A | * | 12/1999 | Kang | 29/832 |
| 6,031,726 A | * | 2/2000 | Vinciarelli et al. | 361/761 |

FOREIGN PATENT DOCUMENTS

| CN | 1-73966 | | 6/1989 | |
|---|---|---|---|---|
| EP | 0 674 474 | | 9/1995 | ............ H05K/7/10 |
| EP | 0 772 379 | | 5/1997 | ............ H05K/7/02 |
| JP | 4-33278 | * | 2/1992 | .................. 439/78 |
| JP | 3-163893 | * | 2/1992 | .................. 439/78 |

OTHER PUBLICATIONS

U.S. application Ser. No. 08/552,522, filed Nov, 6, 1995, "Mounting of Power Converters".

* cited by examiner

Primary Examiner—Lynn Feild
Assistant Examiner—Jean F. Duverne
(74) Attorney, Agent, or Firm—Fish & Richardson P.C.

(57) ABSTRACT

A circuit board has a hole that is large enough to accommodate a portion of an electronic component. Contacts are arranged along a side wall of the accommodated portion of the component. Other contacts are mounted on the board and exposed along the periphery of the hole. The contacts on the component (the first contacts) and the contacts on the board (the second contacts) are arranged to effect electrical contact between the first contacts and the second contacts for a range of positions of the component along a direction perpendicular to the board. A connector for making electrical connection includes a connector body supporting the second contacts in a manner that provides mechanically compliant sliding contact between the first contacts and the second contacts when the component is mounted, and a mechanism that enables the connector to be attached to the board by surface mount soldering.

40 Claims, 11 Drawing Sheets

MOUNTING ELECTRONIC COMPONENTS ON CIRCUIT BOARDS

BACKGROUND

This invention relates to mounting electronic components on circuit boards.

In one approach to mounting an electronic component on a circuit board, shown in U.S. patent application Ser. No. 08/552,522, filed Nov. 6, 1995, the board has a hole that is large enough to accommodate the body of the component. Connection pads located on the surface of the board near the periphery of the hole are soldered to conductors that lie on the body of the component. Because the component lies partly in the hole, the component does not project above or below the hole as far as it would if it were mounted on the surface of a board that had no hole. The finished circuit board assembly, including the components, then may be thinner.

SUMMARY

The invention enables a component to be mounted in any selected position within a range of positions along a direction perpendicular to the board.

Thus, in general, in one aspect, the invention features apparatus for mounting an electronic component on a circuit board. The board has a hole that is large enough to accommodate a portion of the component. Contacts are arranged along a side wall of the accommodated portion of the component. Other contacts are mounted on the board and exposed along the periphery of the hole. The contacts on the component (the first contacts) and the contacts on the board (the second contacts) are arranged to effect electrical contact between the first contacts and the second contacts for a range of positions of the component along a direction perpendicular to the board.

Implementations of the invention may include one or more of the following features. A mounting mechanism fixes the component in a selected one of the positions. The mounting mechanism includes a portion of the component that is not accommodated by the hole, e.g., a heat sink. The mounting mechanism includes spacers.

The second contacts include compliant pins. The first contacts include terminals having surfaces that extend along the direction perpendicular to the board. The second contacts are arranged along two opposite edges of the hole and are soldered to the pads on the board. The pins are compliant in a direction parallel to a surface of the board.

In general, in another aspect, the invention features a connector for making electrical connection from a circuit board to first contacts on a component mounted on the board. The connector includes second contacts, a connector body supporting the second contacts in a manner that provides mechanically compliant sliding contact between the first contacts and the second contacts when the component is mounted, and a mechanism that enables the connector to be attached to the board by surface mount soldering.

Implementations of the invention may include one or more of the following features. The mechanism includes a solderable clip that engages the connector body and is solderable to a pad on the board. The connector has a wall configured to engage a periphery of a hole in the board that accommodates the component. The second contacts include prongs that are solderable to pads on the board to connect the component to a circuit on the board. The second contacts include pins that are force fitted into holes in the connector body. The second contacts include compliant fingers that extend away from the connector body.

The extent to which the component projects above or below the board can be easily adjusted. This allows different components having different heights to be accommodated on a common version of a circuit board. It also allows units of a given component to be mounted on different boards at different positions to match the different heights of other components mounted on the respective boards.

The connectors can be mounted using the same surface mount soldering steps that are used to solder other surface mounted components to the board.

Other advantages and features will become apparent from the following description and from the claims.

DESCRIPTION

Figure 1:
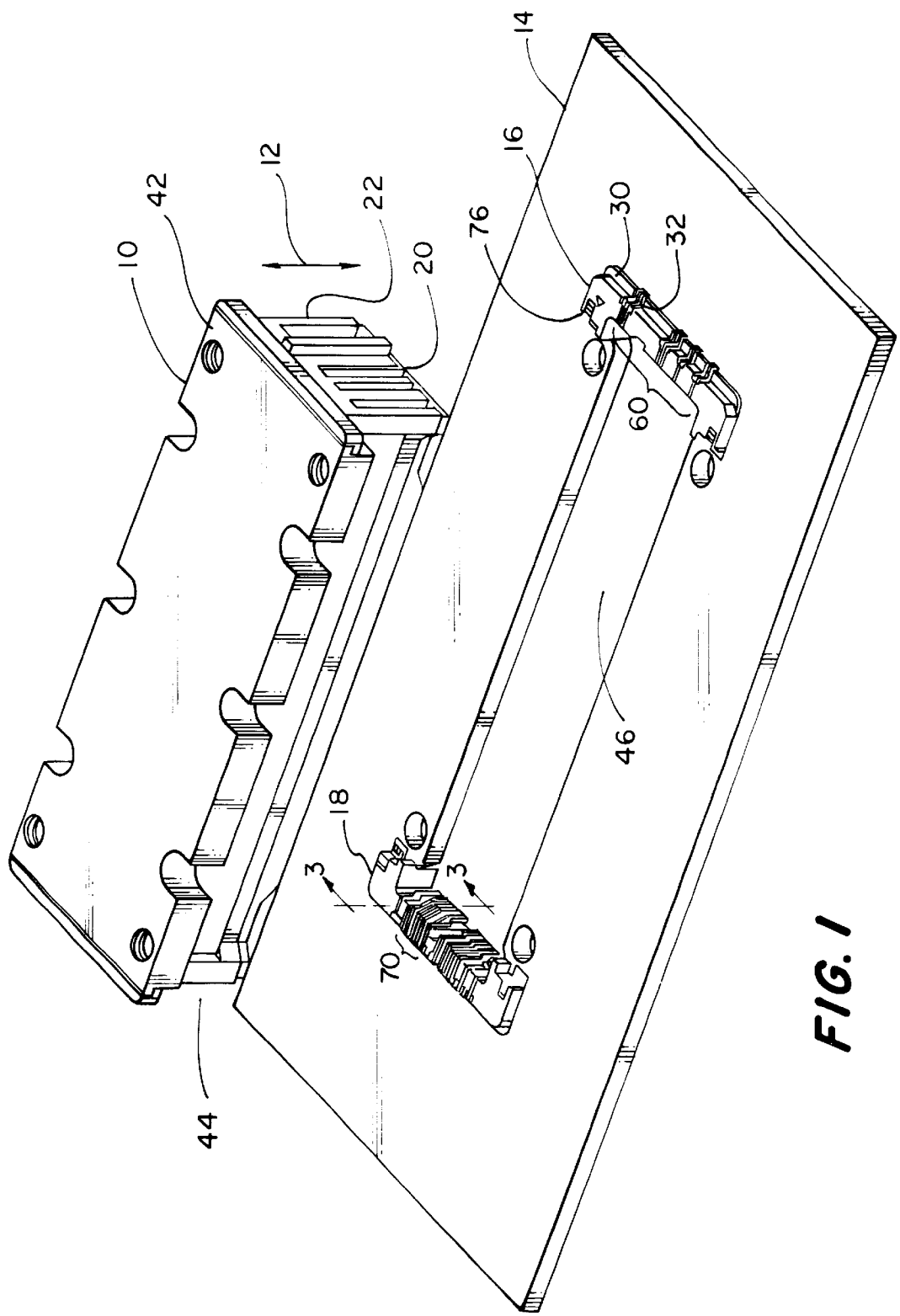
FIG. 1 is a perspective view of a power converter and a circuit board.

As seen in FIG. 1, an electronic component 10, such as a power converter, can be mounted at different positions along a direction 12 perpendicular to the plane of a printed circuit board 14 using surface mounted connectors 16, 18. The connectors provide mechanical support for the component and electrical connection between conductive pads 31 (FIG. 2) on the surface of the board, and terminals 20 on the ends 22 of the component.

Figure 2:
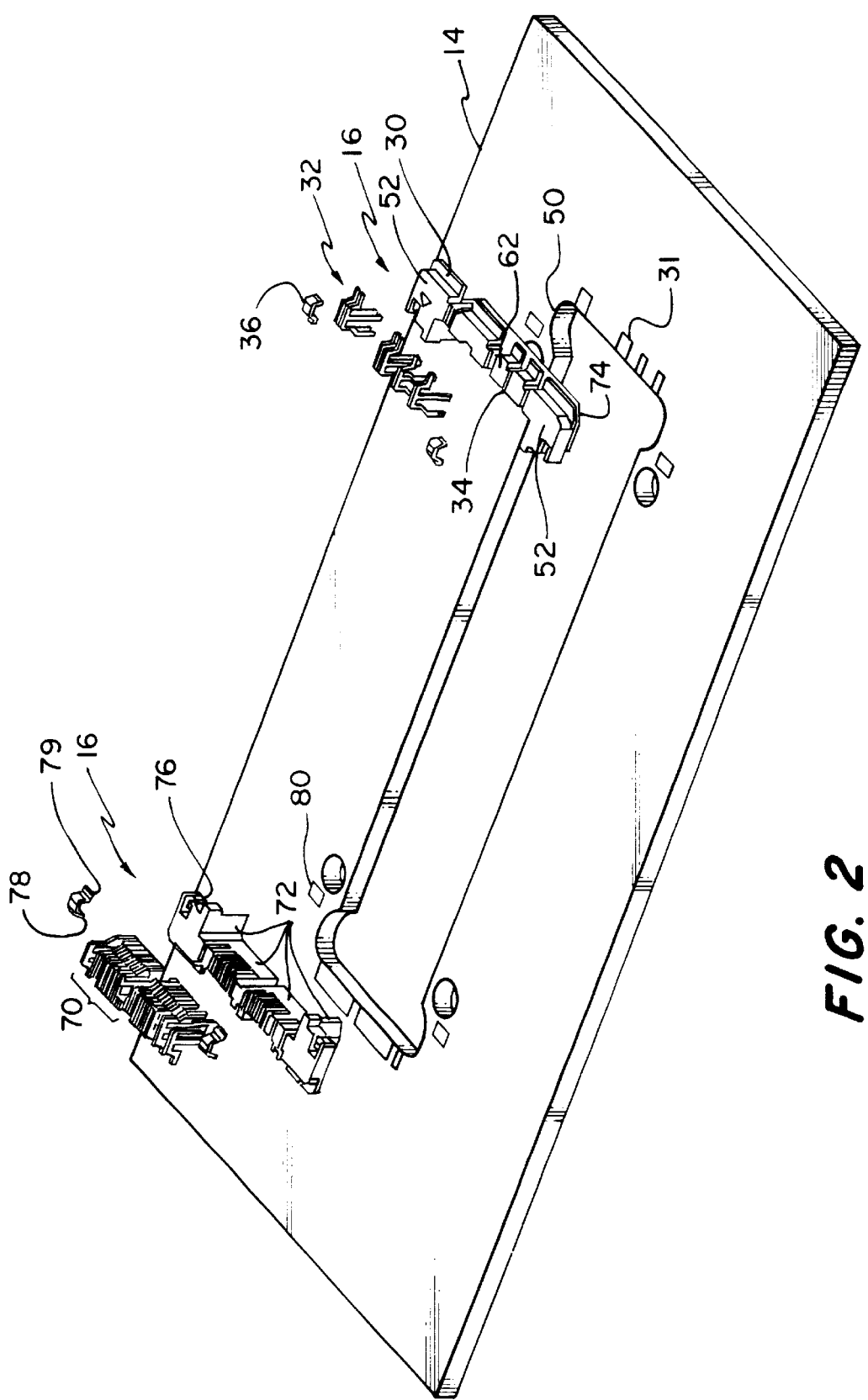
FIG. 2 is a perspective view showing exploded connectors.

As seen in FIG. 2, each of the connectors includes a plastic body 30, a row of conductive terminations 32 that sit within slots 34 provided in the plastic body, and a pair of mechanical retaining clips 36 that are used to surface mount the connector to the board by soldering the clips to the pads 80.

Figure 6:
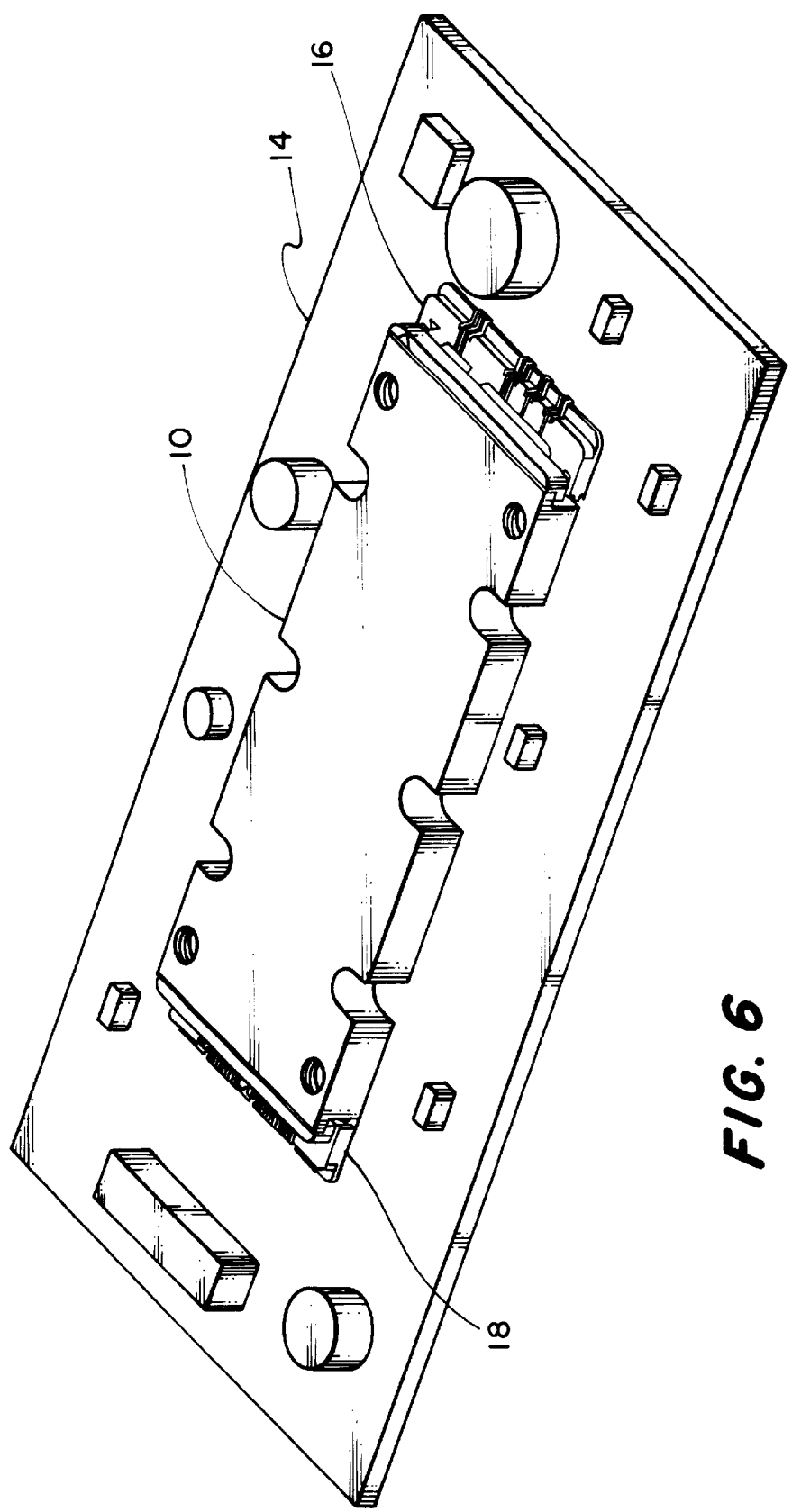
FIGS. 6 through 11 are perspective and side views of three different mounting positions of a power converter on a board.

In the example shown in FIG. 1, the body of the converter has a heat-sinking upper portion 42 that has a larger "footprint" than a lower portion 44 which contains the circuitry of the converter. The footprint of the lower portion 44 is roughly matched by a generally rectangular hole 46 in the board 14 so that the lower portion can be accommodated within the hole when the converter is mounted (as seen in FIG. 6), with appropriate clearance between the periphery of the hole and the outer wall of the converter.

Opposite ends of the hole 46 extend beyond the footprint of the converter to accommodate the connectors 16, 18 and have cutouts 50 to accommodate the portions 52 of the connectors 16, 18 that enable them to be mounted to the board using clips 36.

Between the two mounting portions 52 of each connector 16, 18, is a termination support section 60 that includes the slots 34 separated by walls 62. The sequence of walls and slots is defined for each connector so that the positions of the terminations 32 match the locations of terminals 20 on the ends of the converter.

Figure 4:
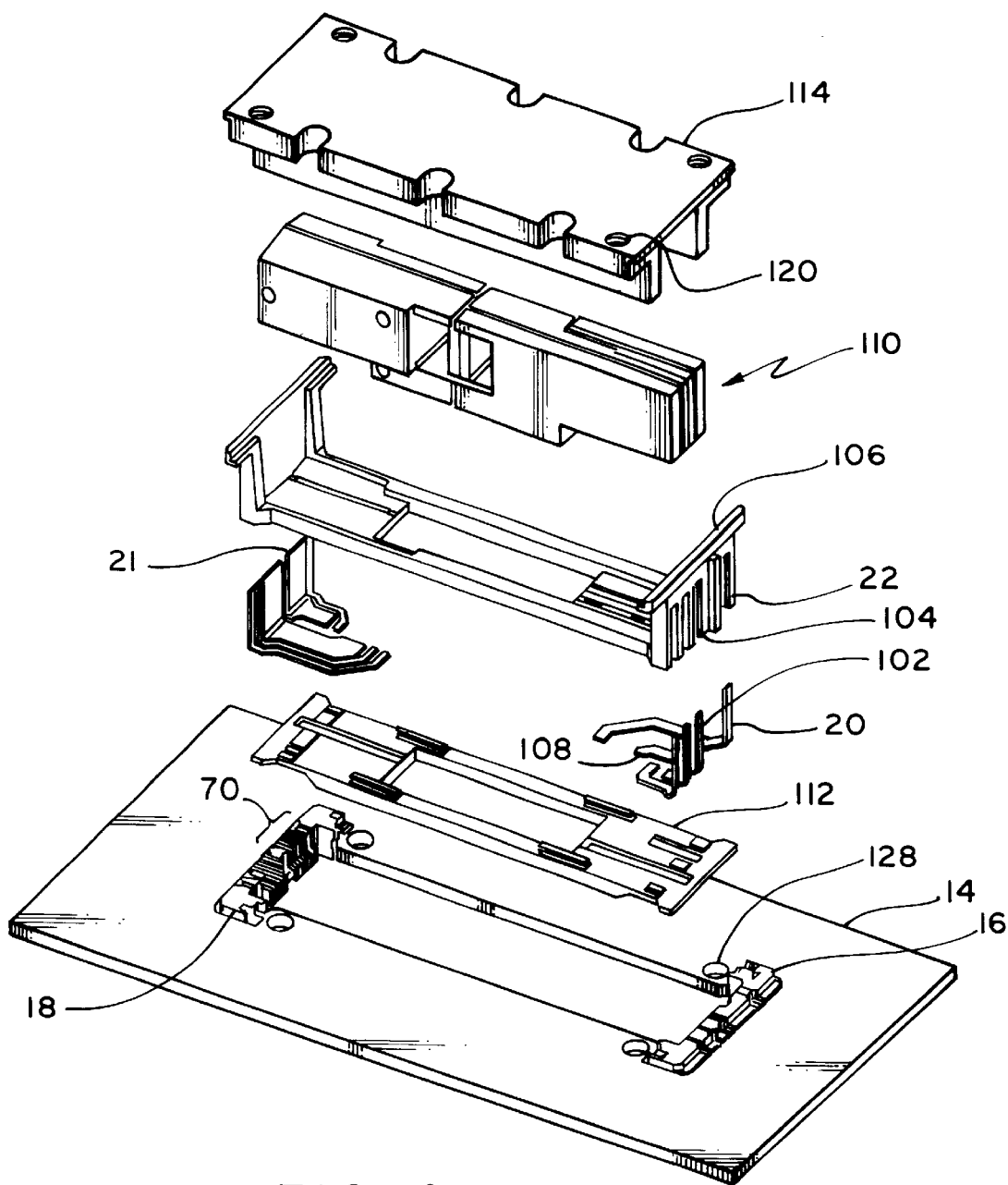
FIG. 4 is an exploded view of a converter and a board.

When a high current terminal of a converter needs to be served, multiple terminations (e.g., a row of closely space terminations 70) can be provided. For example, FIG. 4 shows a row of closely spaced terminations 70 for use with a wide terminal 21. Thus, any configuration of component terminals and a variety of current carrying needs can be met using a single configuration of terminations 32 and a generally similar connector configuration.

To situate each of the connectors securely in the space provided for it at the end of the hole in the board, the connector has a vertical wall 72 with a contour that matches the contour of the peripheral wall of the end of the hole and a horizontal surface 74 that lies against the upper surface of the board.

Each mounting portion 52 of each connector has a hole 76 to receive a gripping end 78 of one of the mechanical retaining clips. The other end of the clip has a flat portion 79 that is soldered to a conductive pad 80 on the surface of the board.

Figure 3:
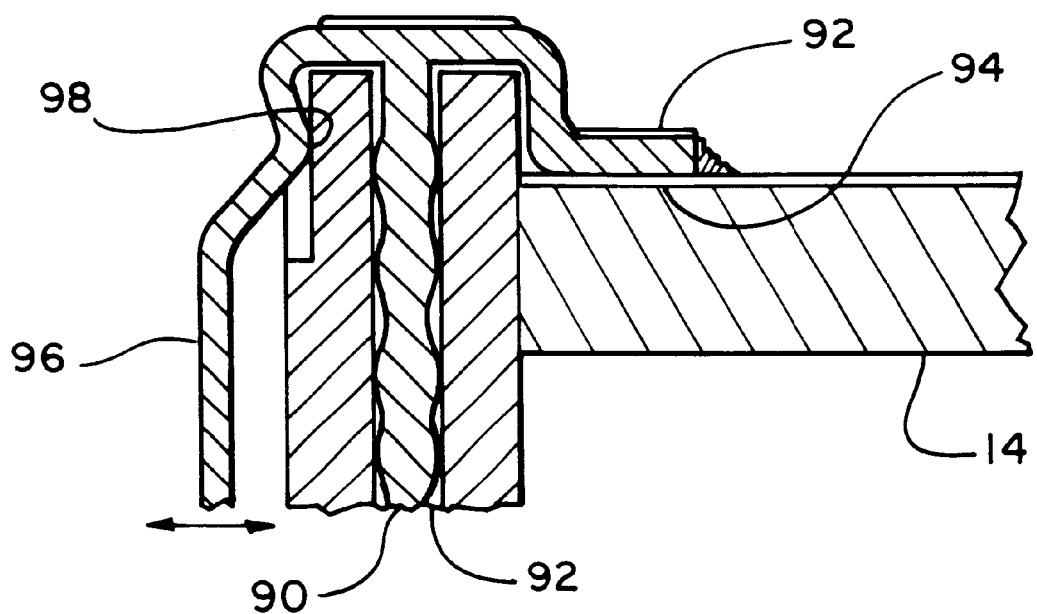
FIG. 3 is a cross-sectional view of a connector at 3—3 of FIG. 1.

As seen in FIG. 3, each of the terminations is stamped from 0.017" thick beryllium-copper sheet and has three "prongs". A middle prong 90 has wavy edges that provide a strong friction fit within a vertical hole 92 in the body of the connector. A surface mount prong 92 extends horizontally and is soldered to a conductive pad 94 on the surface of the board. A third prong 96 serves as a compliant finger (supported at point 98) for contact with a corresponding terminal of the converter.

Each connector is assembled by insert stitching each of the terminations into one of the slots of the connector. The assembled connector is placed into the hole in the board. The mechanical retaining clips are mounted on the connector. Using the same surface mount solder process that is used to solder the other surface mounted components, the clips are soldered to their supporting pads and the terminals are soldered to the corresponding conductive pads of the board.

As seen in FIG. 4, the terminals 20 on the ends of the converter are formed from 0.012" thick copper sheet and are bent at a ninety-degree angle. A vertical portion 102 of each terminal lies within a corresponding slot 104 of a plastic terminal support 106. A horizontal portion 108 of each terminal extends along the bottom of the converter and is soldered to a run of a circuit board that extends vertically from inside the main body 110 of the converter in a manner described more completely in U.S. patent application Ser. No. 08/552,522, filed Nov. 6, 1995. A plastic bottom cap 112 covers the horizontal terminal portions. A heat sink 114 surrounds the body of the converter and provides the larger footprint portion of the converter. The heat sink has four pre-tapped mounting holes 120. Four mounting screws 122 (FIG. 7) extend from the bottom surface of the board, through clearance holes 128 and into the pre-tapped holes to hold the converter securely in place in a way that permits the converter to be removed easily.

Figure 5:
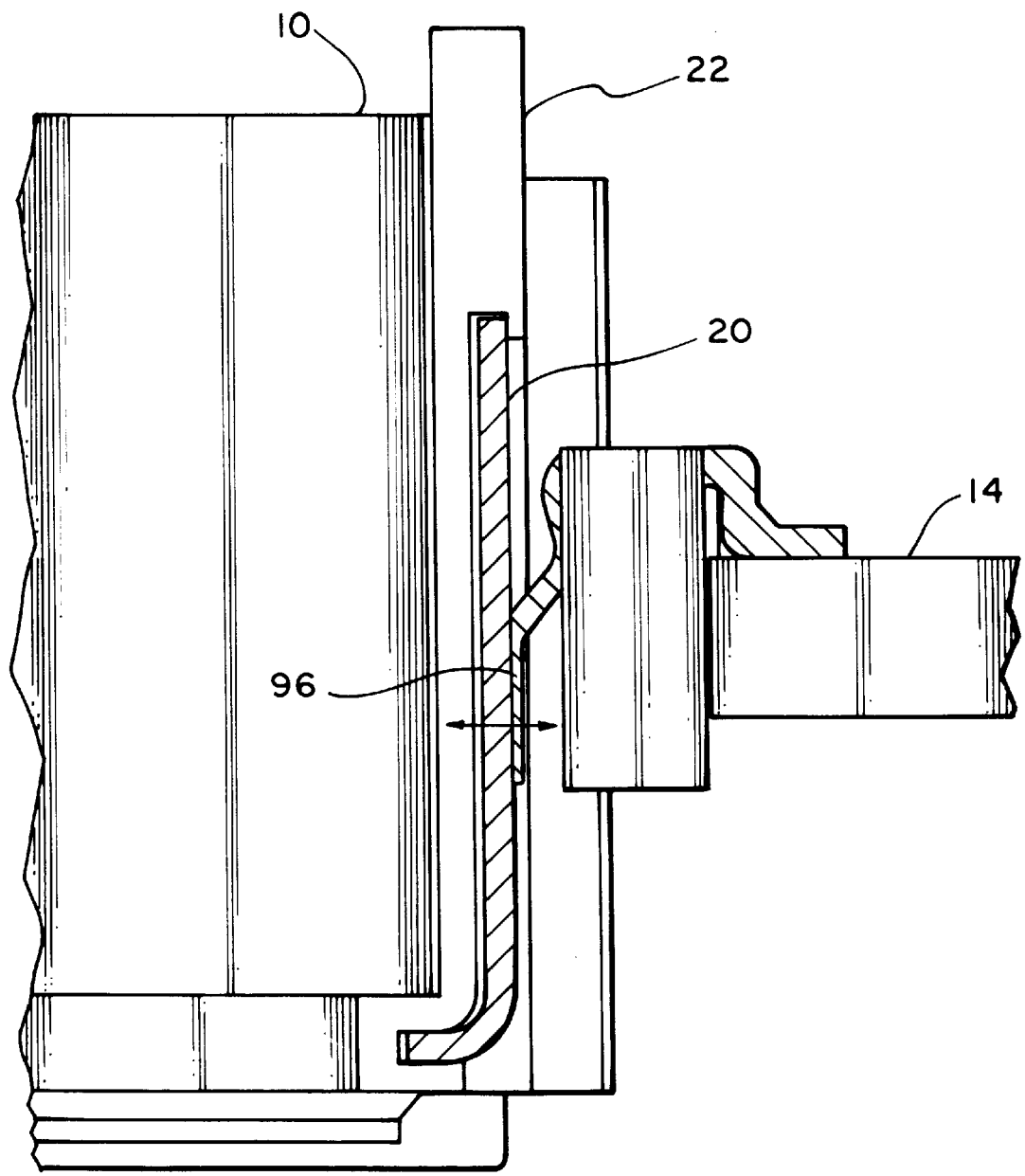
FIG. 5 is a side view of a connection between a terminal and a termination finger.

As seen in FIG. 5, when the converter is mounted in the hole on the board, the finger prong 96 makes contact along the surface of the vertical portion of the converter terminal 20. The vertical portion of the converter terminal is long enough to permit a good contact to be made at a wide range of vertical positions of the converter.

Figure 7:
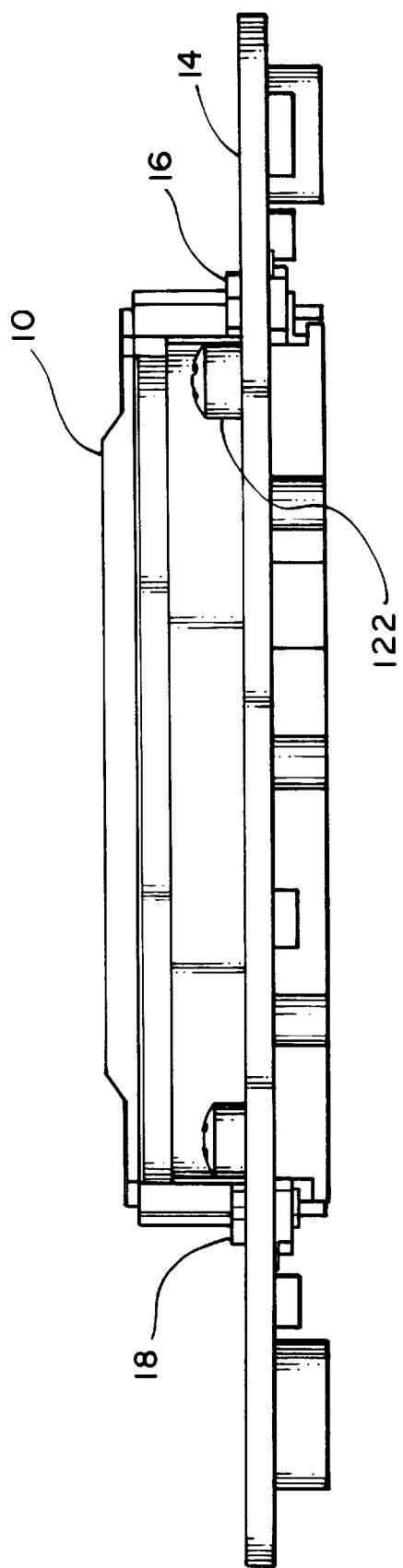

In one position, shown in FIGS. 6 and 7, the converter is mounted with the bottom surface of the heat sink in contact with the top surface of the board. The body of the converter then projects more on one side of the board than on the other.

Figure 8:
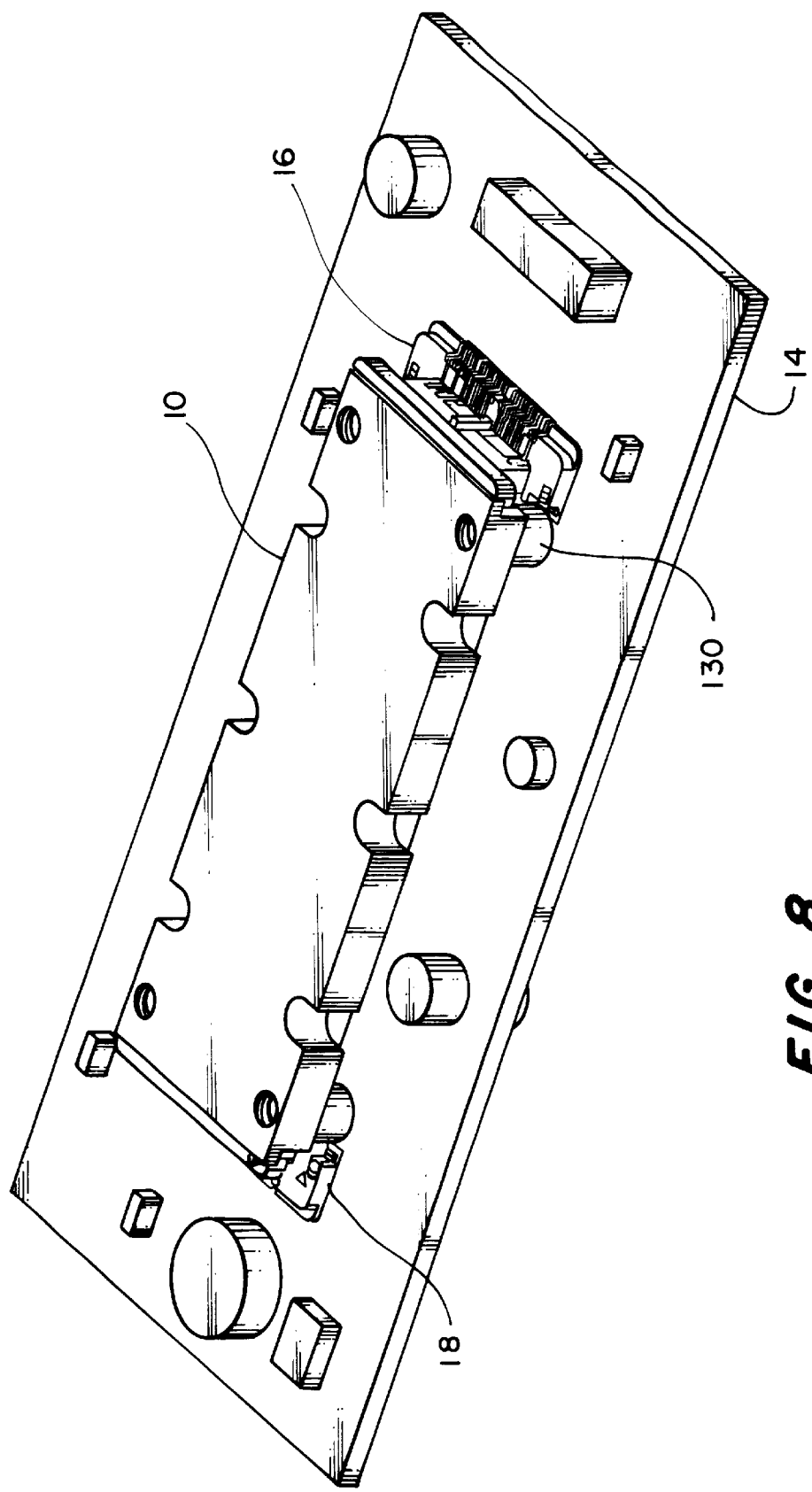
Figure 9:
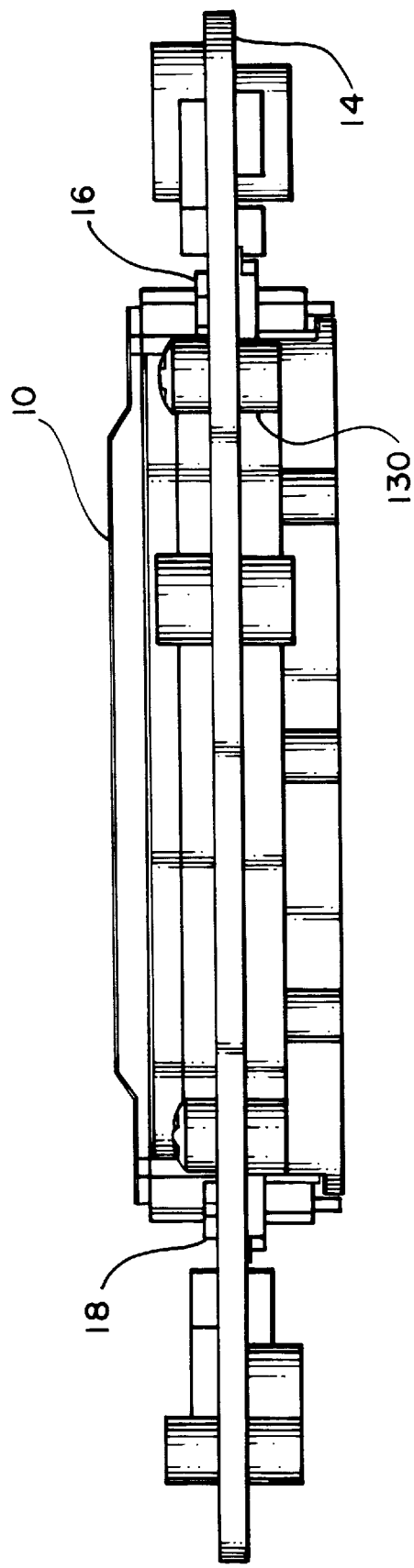

In another position, shown in FIGS. 8 and 9, the bottom of surface of the heat sink is spaced from the board by spacers 130. The body of the converter then extends by about equal amounts on opposite sides of the board.

Figure 10:
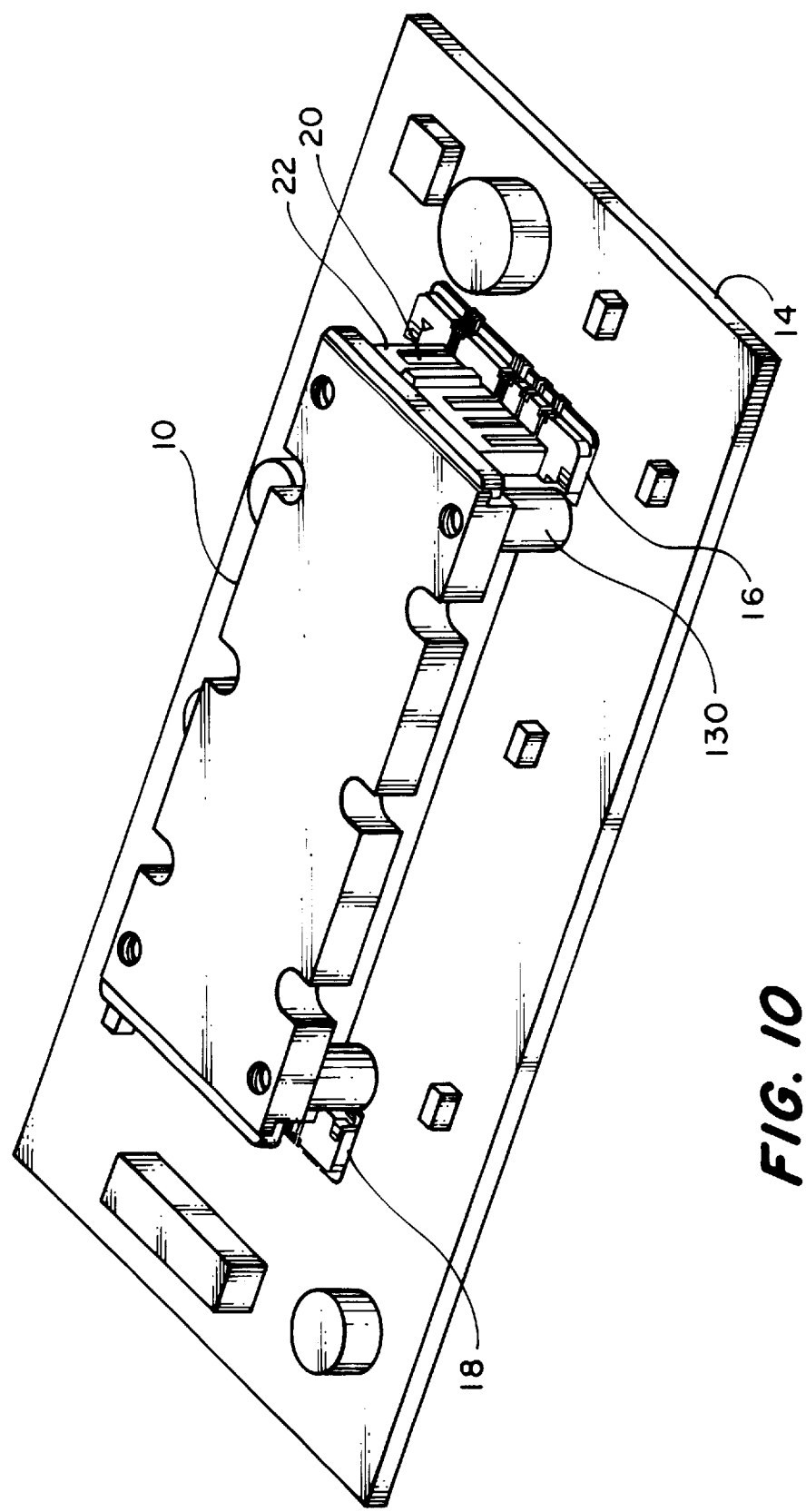
Figure 11:
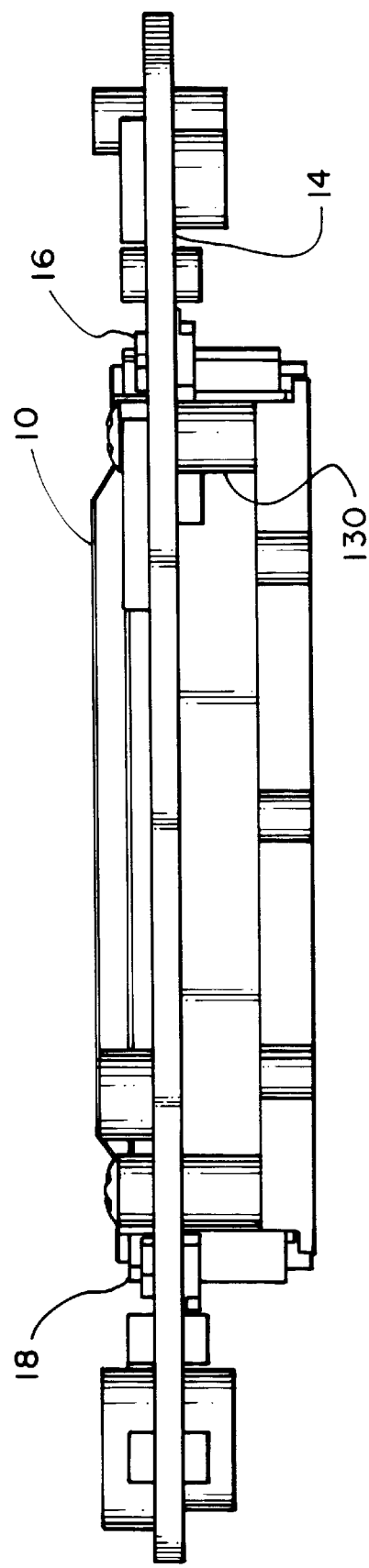

In a third configuration, shown in FIGS. 10 and 11, the heat sink is spaced even farther away from the board.

During assembly, after the connectors are mounted on the board, any needed spacers are put into place and the converter is slipped into the hole in the board. The terminals on the converter make contact with, and slide along, the fingers of the terminations until the heat sink reaches its final position with the spacers between the heat sink and the board. The screws are then attached.

The compliance of the termination fingers enables them to accommodate small variations in the size of the converter body and the configuration of the converter terminals as the converter is being mounted, while still assuring a good electrical connection.

Other embodiments are within the scope of the following claims. For example, the component need not be a power converter. The hole may have a wide variety of shapes and the number, shape, and locations of the connectors can vary widely. The terminations and terminals could be transposed so that the component bears the compliant fingers and the connectors bear the relatively long vertical terminal portions.

What is claimed is:

1. Apparatus comprising
   a component having a body, a first portion of the body having a first footprint, and two or more terminals arranged along a side wall of the first portion,
   a circuit board having a first hole for receiving the first portion of the component body, the circuit board having an interior wall defining the first hole,
   a connector mounted to the circuit board for making contact with the terminals, the connector having a body, two or more contacts, and a mounting mechanism,
   the two or more contacts having first ends for connection to respective conductive pads on the circuit board and second ends for contact with the terminals,
   the connector body having an external surface for supporting the side wall of the component, an internal surface for making contact with a wall of the circuit board, and a hidden surface for mating with a surface of the circuit board,
   the external surface of the connector body and the interior wall of the circuit board together forming an opening to accommodate the first footprint.

2. The apparatus of claim 1 further wherein the connector supports the sidewall and makes electrical contact with the terminals over a range of positions of the component relative to the board in a direction perpendicular to the board.

3. The apparatus of claim 2 further comprising a component mounting mechanism that fixes the component in a selected one of the positions.

4. The apparatus of claim 3 in which the component mounting mechanism includes a second portion of the body protruding beyond the footprint.

5. The apparatus of claim 4 wherein the second portion comprises a heat sink.

6. The apparatus of claim 5 wherein the component mounting mechanism comprises spacers.

7. The apparatus of claim 1 wherein the first ends of the contacts are soldered to the respective pads.

8. The apparatus of claim 1 in which the two or more terminals span a portion of the sidewall in a direction perpendicular to the circuit board.

9. The apparatus of claim 1 wherein the mounting mechanism of the connector further comprises a mounting clip having an end for soldering to the circuit board and another end for securing the connector body.

10. The apparatus of claim 1 wherein the contacts are arranged along two opposite edges of the hole.

11. The apparatus of claim 10 wherein the contacts along the opposite edges of the hole are spaced to provide a pressure fit against the terminals with the first portion in the opening.

12. The apparatus of claim 10 wherein
the connector body comprises a first connector segment and a second connector segment respectively comprising first and second interior walls, and
the opening is formed by the first and second interior walls separated along a circumference of the opening by the exterior wall.

13. The apparatus of claim 1, 6 or 12 wherein the opening further comprises a shape to match the footprint.

14. An apparatus comprising:
a receptacle for mechanically supporting and making electrical connection to a component,
the receptacle comprising a circuit board and a connector,
the receptacle having a hole to accommodate a footprint of a first portion of a body of the component, the hole having an interior wall defined by the circuit board along a first segment and by a connector body along a second segment,
the connector having electrical contacts extending laterally into the opening to make contact with terminals on a sidewall of the first portion of the component;
the connector body comprising a first connector body and a second connector body, and
the second segment is divided into at least two portions by the first segment.

15. The apparatus of claim 14 wherein the connector comprises a first connector and a second connector mounted to the circuit board on opposite sides of the hole.

16. The apparatus of claim 15 wherein the first and second connectors are spaced so that the electrical contacts provide a pressure fit with the first portion of the component in the hole.

17. The apparatus of claim 14 or 15 wherein the hole further comprises a shape to match the footprint.

18. An apparatus comprising:
a receptacle for mechanically supporting and making electrical connection to a component,
the receptacle comprising a circuit board and a connector,
the receptacle having an opening to accommodate a footprint of a first portion of a body of the component, the opening having a circumference defined by the circuit board along a first segment and by a connector body along a second segment,
the connector having electrical contacts extending into the opening to make contact with terminals on a sidewall of the first portion of the component;
a hole in the circuit board comprising a first hole segment and a second hole segment,
the first hole segment defining the opening along the first segment, and
the second hole segment being larger than the opening along the second segment.

19. The apparatus of claim 18 wherein the connector body lies in the second hole segment.

20. The apparatus of claim 19 wherein the second hole segment has a contour to match an edge of the connector body.

21. The apparatus of claim 14 wherein the contacts are soldered to respective pads on the circuit board.

22. An apparatus comprising:
a receptacle for mechanically supporting and making electrical connection to a component,
the receptacle comprising a circuit board and a connector,
the receptacle having a hole to accommodate a footprint of a first portion of a body of the component, the hole having an interior wall defined by the circuit board along a first segment and by a connector body along a second segment,
the connector having electrical contacts extending laterally into the opening to make contact with the terminals on a sidewall of the first portion of the component,
wherein the contacts comprise a cantilever having a first end for contacting the terminals, a second end soldered to the board and a prong secured to the connector body.

23. The apparatus of claim 22 wherein the contacts are stamped from beryllium copper.

24. The apparatus of claims 1, 14, or 22 wherein a plurality of the contacts are connected in parallel to contact a single terminal.

25. The apparatus of claim 24 wherein the plurality of the contacts are spaced closer together than others of the contacts.

26. The apparatus of claims 1, 14, or 23 wherein the connector body further comprises slots separated by walls and the contacts are in the slots.

27. The apparatus of claim 14, further comprising the component mounted with the first portion in the hole.

28. The apparatus of claims 1 or 27 wherein the component comprises a power converter.

29. The apparatus of claim 1 or 27 wherein the terminals are positioned in slots in the sidewall extending in a direction perpendicular to the board.

30. The apparatus of claim 29 wherein the terminals have a length along the perpendicular direction sufficient to provide a range of positions for the component relative to the board along the perpendicular direction in the hole.

31. The apparatus of claim 14 further comprising a component mounting mechanism.

32. The apparatus of claim 3 or 31 wherein the component mounting mechanism is separate from the connector.

33. The apparatus of claim 1, 6, 9, 12, 14, or 20 wherein the connector is surface mount soldered to the board.

34. The apparatus of claim 1 or 14 wherein the contacts further comprise compliant pins.

35. The apparatus of claim 34 wherein the pins are compliant in a direction parallel to the surface of the board.

36. The apparatus of claim 1 or 14 wherein the contacts further comprise a prong and the connector body comprises a receptacle for the prong.

37. The apparatus of claim 36 wherein the prong is force fitted into the receptacle.

38. The apparatus of claim 18 wherein the hole further comprises a shape to match the footprint.

39. The apparatus of claim 18 wherein the opening further comprises a shape to match the footprint.

40. An apparatus comprising:
   a receptacle for mechanically supporting and making electrical connection to a component,
   the receptacle comprising a circuit board and a connector,
   the receptacle having a hole to accommodate a footprint of a first portion of a body of the component, the hove having an interior wall defined by the circuit board along the first segment and by a connector body along a second segment,
   the connector having electrical contacts extending laterally into the opening to make contact with terminals on sidewall of the first portion of the component, and
   the contacts further comprise pins compliant in a direction parallel to the surface of the board.

* * * * *

UNITED STATES PATENT AND TRADEMARK OFFICE
CERTIFICATE OF CORRECTION

| | |
|---|---|
| PATENT NO. | : 6,623,281 B2 |
| APPLICATION NO. | : 09/340707 |
| DATED | : September 23, 2003 |
| INVENTOR(S) | : Patrizio Vinciarelli and Gary C. Keay |

Page 1 of 1

It is certified that error appears in the above-identified patent and that said Letters Patent is hereby corrected as shown below:

Cover Page:

Under References Cited, U.S. Patent Documents:

Patent 4,417,296, "Shelhorn" should be replaced with --Schelhorn--

Under References Cited, Foreign Patent Documents

Patent 1-73966, "6/1989" should be replaced with --5/1989--

Column 3
Line 2, replace "space" with --spaced--

Column 6
Line 36, replace "23" with --22--

Column 7
Line 1, replace "18" with --27--

Column 7
Line 11, replace "hove" with --hole--

Signed and Sealed this

Nineteenth Day of December, 2006

JON W. DUDAS
*Director of the United States Patent and Trademark Office*